US008884157B2

(12) United States Patent
Lin et al.

(10) Patent No.: US 8,884,157 B2
(45) Date of Patent: Nov. 11, 2014

(54) METHOD FOR MANUFACTURING OPTOELECTRONIC DEVICES

(75) Inventors: Yi-Hung Lin, Hsinchu (TW); Yu-Chih Yang, Hsinchu (TW); Wu-Tsung Lo, Hsinchu (TW)

(73) Assignee: Epistar Corporation (TW)

( * ) Notice: Subject to any disclaimer, the term of this patent is extended or adjusted under 35 U.S.C. 154(b) by 0 days.

(21) Appl. No.: 13/469,236

(22) Filed: May 11, 2012

(65) Prior Publication Data
US 2013/0298972 A1 Nov. 14, 2013

(51) Int. Cl.
*H01L 31/18* (2006.01)
*H01L 31/0224* (2006.01)

(52) U.S. Cl.
USPC ................... 136/255; 136/252; 438/98

(58) Field of Classification Search
CPC .... H01L 31/0224; H01L 31/18; H01L 31/075
USPC ..................... 136/255, 252; 438/98
See application file for complete search history.

(56) References Cited

U.S. PATENT DOCUMENTS

| 4,227,941 | A | * | 10/1980 | Bozler et al. ............... | 136/255 |
|---|---|---|---|---|---|
| 4,278,473 | A | * | 7/1981 | Borden ..................... | 136/249 |
| 4,547,622 | A | * | 10/1985 | Fan et al. ................... | 136/249 |
| 4,737,197 | A | * | 4/1988 | Nagahara et al. ........... | 136/256 |
| 5,009,721 | A | | 4/1991 | Matsumoto et al. | |
| 7,449,630 | B2 | * | 11/2008 | Ho et al. .................... | 136/255 |
| 7,838,761 | B2 | | 11/2010 | Lee | |
| 2006/0076049 | A1 | | 4/2006 | Cotal et al. | |
| 2008/0149173 | A1 | * | 6/2008 | Sharps ..................... | 136/255 |
| 2008/0245409 | A1 | * | 10/2008 | Varghese et al. ........... | 136/256 |
| 2009/0183776 | A1 | * | 7/2009 | Kwag et al. ................ | 136/261 |

* cited by examiner

*Primary Examiner* — Golam Mowla
(74) *Attorney, Agent, or Firm* — Bacon & Thomas, PLLC

(57) ABSTRACT

A method for manufacturing an optoelectronic device includes steps of: providing an optoelectronic structure; forming a first metal contact layer having a pattern on the upper surface of the optoelectronic structure; forming a dielectric layer on the first metal contact layer and the optoelectronic structure; removing the dielectric layer on the first metal contact layer; and forming an electrode structure on the first metal contact layer.

10 Claims, 3 Drawing Sheets

METHOD FOR MANUFACTURING OPTOELECTRONIC DEVICES

TECHNICAL FIELD

The application relates to an optoelectronic device and the method for manufacturing the optoelectronic device.

DESCRIPTION OF BACKGROUND ART

Because of the shortage of the petroleum energy resource and the promotion of the environment protection, people continuously and actively study the art related to the replaceable energy and the regenerative energy resources in order to reduce the dependence of petroleum energy resource and the influence on the environment. The solar cell is an attractive candidate among those replaceable energy and the regenerative energy resources because the solar cell can directly convert solar energy into electricity. In addition, there are no harmful substances like carbon oxide or nitride generated during the process of generating electricity so there is no pollution to the environment.

The basic structure of a solar-cell element includes an optoelectronic stack, a front electrode formed on the upper surface of the optoelectronic stack, and a back electrode formed on the bottom surface of the optoelectronic stack. Furthermore, for receiving most solar light, the upper surface of the optoelectronic stack may be covered by an anti-reflecting layer.

The solar-cell element can further connect to a base via a bonding layer or adhesion to form a light-absorbing device. In additional, the base can further include at least a circuit to electrically connect to the electrode of the solar cell element via a conductive structure such as metal wire.

SUMMARY OF THE DISCLOSURE

A method for manufacturing an optoelectronic device includes steps of: providing an optoelectronic structure; forming a first metal contact layer having a pattern on the upper surface of the optoelectronic structure; forming a dielectric layer on the first metal contact layer and the optoelectronic structure; removing the dielectric layer on the first contact metal layer; and forming an electrode structure on the first metal contact layer.

A method for manufacturing an optoelectronic device includes steps of: providing an optoelectronic structure; forming a semiconductor contact layer on the upper surface of the optoelectronic structure; forming a patterned contact layer on the semiconductor contact layer; removing the semiconductor contact layer till a width of the semiconductor contact layer is less than that of the patterned contact layer; forming a dielectric layer on the patterned contact layer and the optoelectronic structure; removing the dielectric layer on the patterned contact layer; and forming an electrode structure on the patterned contact layer.

DETAILED DESCRIPTION OF PREFERRED EMBODIMENTS

Figure 1A:
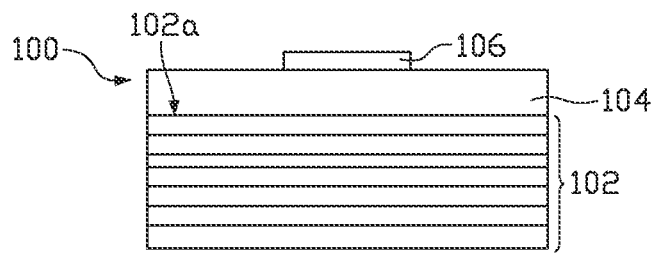
FIGS. 1A to 1F show a method for manufacturing an optoelectronic device of a first embodiment of the present application.

Referring to FIGS. 1A to 1F, a method for manufacturing an optoelectronic device is disclosed. As shown in FIG. 1A, an optoelectronic device 100 is provided, and the optoelectronic device 100 includes an optoelectronic structure 102, and a semiconductor contact layer 104 formed on the upper surface 102a of the optoelectronic structure 102. A metal contact layer 106 can be formed on the semiconductor contact layer 104 and has a pattern formed by deposition and lithography process. The material of the metal contact layer 106 can be Au.

Figure 1B:
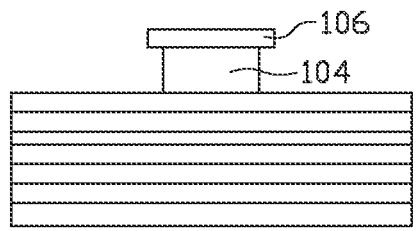

As shown in FIG. 1B, removing the semiconductor contact layer 104 not covered by the metal contact layer 106 by etching solution for example. The etching solution for removing the semiconductor contact layer 104 can contain $H_2O_2$, and the etching solution does not etch away the metal contact layer 106. Accordingly the metal contact layer 106 can be a patterned mask to define the pattern of the semiconductor contact layer 104.

Figure 1C:
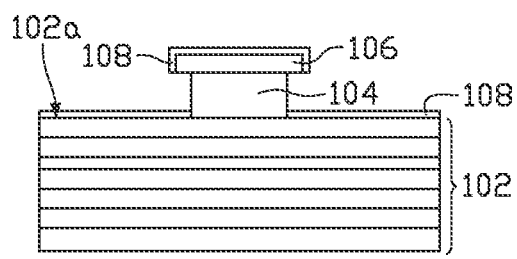

As shown in FIG. 1C, a dielectric layer 108 is formed on the upper surface 102a of the optoelectronic structure 102 and the metal contact layer 106.

Figure 1D:
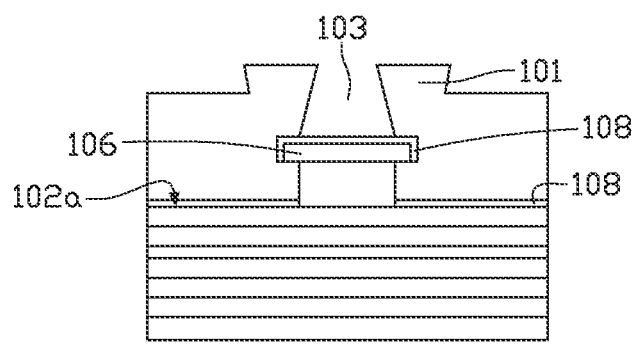

As shown in FIG. 1D, providing a photo resistor 101 on the dielectric layer 108, and forming an opening 103 to expose the dielectric layer 108 on the metal contact layer 106.

Figure 1E:
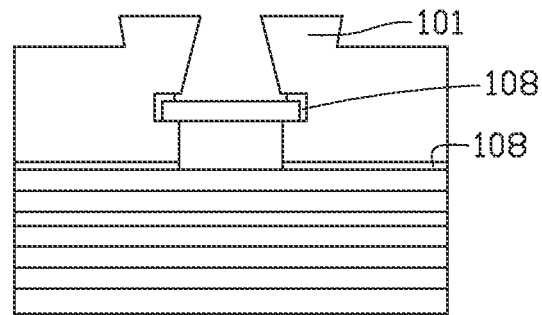

As shown in FIG. 1E, removing the dielectric layer 108 on the metal contact layer 106 by etching, and the photo resistor 101 can be the mask for removing the dielectric layer 108.

Figure 1F:
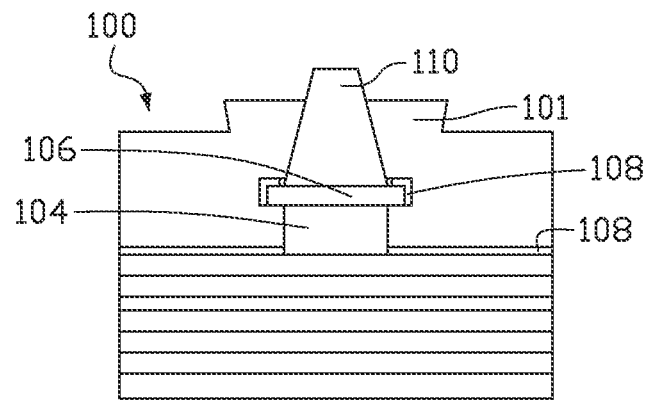

As shown in FIG. 1F, forming an electrode structure 110 on the metal contact layer 106 by evaporation, electrical plating or chemical plating for example, and the photo resistor 101 can be the mask for forming the electrode structure 110, and electrode structure 110, the metal contact layer 106, and the semiconductor contact layer 104 have the same pattern from top view of the optoelectronic device 100. In accordance with the shape of the photo resistor 101, the width of the electrode structure 110 is gradually wider from top to bottom. The material of the electrode structure 110 can be Ag or Ag alloy, and since the semiconductor contact layer 104 is removed before forming the electrode structure 110, the etching solution for removing the semiconductor contact layer 104 does not influence the electrode structure 110. In a conventional manufacturing method of a solar-cell device, the electrode structure is formed and patterned on the semiconductor contact layer, and the semiconductor contact layer is patterned according to the electrode structure by etching. However, if the material of the electrode structure contains Ag, the semiconductor layer is contaminated by Ag in the etching process, and therefore is hardly removed completely. After forming the electrode structure 110, the photo resistor 101 can be removed to expose the dielectric layer 108 and the electrode structure 110.

Figure 1G:
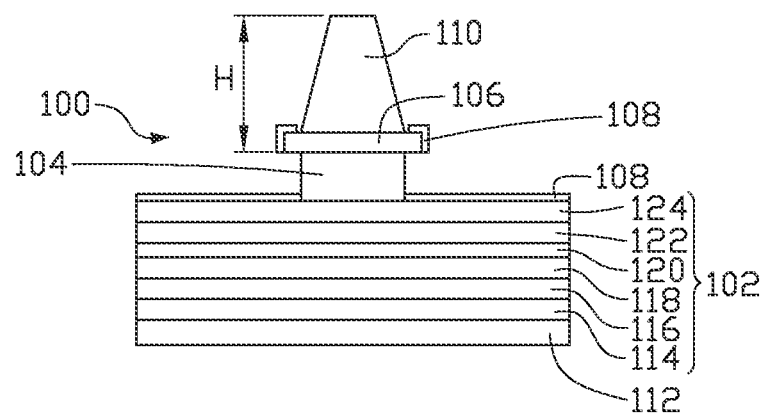
FIG. 1G illustrates an optoelectronic device of a first embodiment of the present application.

Referring to FIG. 1G, an optoelectronic device 100 formed by the manufacturing method according to FIGS. 1A to 1G is a solar-cell device and includes an optoelectronic structure 102 being a multi-junction stack. The optoelectronic device 100 includes: a back electrode 112; the optoelectronic structure 102 including: a conductive substrate 114 having a first junction formed on the back electrode 112, wherein the first junction is formed by doping two different materials in the conductive substrate 114; a first tunnel junction 116 formed on the conductive substrate 114; a first semiconductor layer 118 formed on the first tunnel junction 116, wherein the first semiconductor layer 118 has a second junction formed by sequentially doping two different materials therein during epitaxial growth process; a second tunnel junction 120 formed on the first semiconductor layer 118; and a second semiconductor layer 122 formed on the second tunnel junction 120, wherein the second semiconductor layer 122 has a third junction formed by sequentially doping two different materials therein during epitaxial growth process. The first junction, second junction and third junction include PN junction or P-i-N junction respectively. The material of the conductive substrate 114 can be Ge, and the material of the first semiconductor layer 118 can be GaAs, and the material of the second semiconductor layer 122 can be InGaP. The first tunnel junction 116 and the second tunnel junction 120 can include InGaAs/AlGaInAs junction and InGaP/AlGaInAs junction, respectively.

The optoelectronic device 100 further includes a light-absorbing layer 124 on the second semiconductor layer 122 for receiving more light from outside, and the material of the light-absorbing layer 124 can include AlInP.

The semiconductor contact layer 104 forms between the light-absorbing layer 124 and the metal contact layer 106, and the metal contact layer 106 and the semiconductor contact layer 104 form a contact structure. The electrode structure 110 being the front electrode of the solar-cell device (optoelectronic device 100) forms on the metal contact layer 106, and the dielectric layer 108 being an anti-reflecting layer forms on the light-absorbing layer 124 and partial area of the metal contact layer 106. The material of the dielectric layer 108 can be $TiO_2$.

Conventionally, the material of front electrode of solar-cell device is Au, however the cost of Au has been largely raised year by year, and some solar-cell vendor turned to Ag for replacing Au for the material of front electrode of solar-cell device. The forming method of Ag front electrode is different from that of Au front electrode because of Ag may be partially etched by the etching solution for etching the semiconductor contact layer, therefore the semiconductor contact layer may not be completely etched away so as to cause electrically abnormal of solar-cell device. One way to solve the problem is that forming anti-reflecting layer on solar-cell device, then forming Ag layer on the anti-reflecting layer and heating and pressing the Ag layer to pass through the anti-reflecting layer to contact the semiconductor layer of solar-cell device. The Ag front electrode formed by passing through anti-reflecting layer may cause bad ohmic contact between Ag front electrode and semiconductor layer of solar-cell device. By the manufacturing method of present application, the Ag front electrode is well ohmically contact with the semiconductor layer of solar-cell device via a metal contact layer and a semiconductor conductor layer. Moreover, by the manufacturing method of the present application, the etching solution for removing the semiconductor contact layer does not influence by the Ag front electrode, so that the semiconductor contact layer can be fully removed to avoid the malfunction of the solar-cell device.

Figure 2:
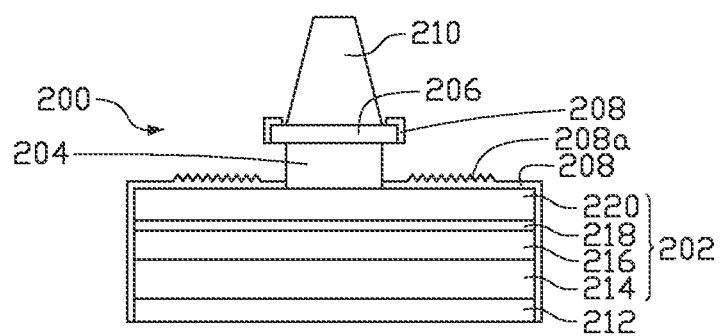
FIG. 2 illustrates an optoelectronic device of a second embodiment of the present application.

Referring to FIG. 2, an optoelectronic device of a second embodiment of the present application is disclosed, and the manufacturing method thereof is similar to that of the first embodiment. The optoelectronic device 200 being a light-emitting element includes: a light-emitting stack 202 including a substrate 214, a lower semiconductor layer 216 formed on the substrate 214, an active layer 218 formed on lower semiconductor layer 216, and an upper semiconductor layer 220 formed on the active layer 218; a semiconductor contact layer 204 formed on the upper surface of the light-emitting stack 202; a metal contact layer 206 made of Au formed on the semiconductor contact layer 204; an upper electrode 210 made of Ag or Ag alloy formed on the metal contact layer 206; a dielectric layer 208 formed on the upper surface and side surface of the light-emitting stack 202 and partial area of the metal contact layer 206, wherein the dielectric layer 208 has roughening structure 208*a* on partial surface thereof for enhancing light extraction.

The lower semiconductor layer 216, active layer 218, and upper semiconductor layer 220 can be formed in an MOCVD chamber and composed of materials such as the series of aluminum gallium indium phosphide (AlGaInP), the series of aluminum gallium indium nitride (AlGaInN), and/or the series of zinc oxide (ZnO). The active layer 218 can be configured to be a single heterostructure (SH), a double heterostructure (DH), a double-side double heterostructure (DDH), or a multi-quantum well (MQW) structure.

The substrate of the present embodiment can include SiC, Si, GaAs or other conductive material for forming a light-emitting stack thereon by epitaxial growth, or a conductive bonding structure can form between the substrate and the light-emitting stack, and the substrate can be a transparent material such as SiC, GaP or ZnO, or a high heat-dissipation material such as metal or ceramic.

Although the present application has been explained above, it is not the limitation of the range, the sequence in practice, the material in practice, or the method in practice. Any modification or decoration for present application is not detached from the spirit and the range of such.

What is claimed is:

1. A method for manufacturing an optoelectronic device comprising steps of:
    providing an optoelectronic structure;
    forming a first metal contact layer having a pattern on the upper surface of the optoelectronic structure;
    forming a dielectric layer on the first metal contact layer and the optoelectronic structure;
    removing the dielectric layer on the first metal contact layer; and
    forming an electrode structure on the first metal contact layer.

2. The method for manufacturing the optoelectronic device according to claim 1, further comprising forming a second contact layer on the upper surface of the optoelectronic structure before forming the first metal contact layer.

3. The method for manufacturing the optoelectronic device according to claim 2, further comprising removing the second contact layer not covered by the first metal contact layer before forming the dielectric layer.

4. The method for manufacturing the optoelectronic device according to claim 3, wherein the second metal contact layer is removed by an etching solution containing $H_2O_2$.

5. The method for manufacturing the optoelectronic device according to claim 2, wherein the material of the second metal contact layer comprises GaAs.

6. The method for manufacturing the optoelectronic device according to claim 1, wherein the material of the first metal contact layer is Au, and/or the material of the electrode structure comprises Ag or Ag alloy.

7. A method for manufacturing an optoelectronic device comprising steps of:
    providing an optoelectronic structure;
    forming a semiconductor contact layer on the upper surface of the optoelectronic structure;
    forming a patterned contact layer on the semiconductor contact layer;
    removing the semiconductor contact layer till a width of the semiconductor contact layer is less than that of the patterned contact layer;

forming a dielectric layer on the patterned contact layer and the optoelectronic structure;

removing the dielectric layer on the patterned contact layer; and forming an electrode structure on the patterned contact layer.

8. The method for manufacturing the optoelectronic device according to claim 7, wherein the semiconductor contact layer is removed by an etching solution containing $H_2O_2$.

9. The method for manufacturing the optoelectronic device according to claim 7, wherein the material of the semiconductor contact layer comprises GaAs.

10. The method for manufacturing the optoelectronic device according to claim 7, wherein the material of the patterned contact layer is Au, and/or the material of the electrode structure comprises Ag or Ag alloy.

* * * * *